United States Patent
Shin et al.

(10) Patent No.: US 9,281,385 B2
(45) Date of Patent: Mar. 8, 2016

(54) SEMICONDUCTING GRAPHENE COMPOSITION, AND ELECTRICAL DEVICE INCLUDING THE SAME

(75) Inventors: Hyeon-jin Shin, Suwon-si (KR); Jae-young Choi, Suwon-si (KR); Joung-real Ahn, Suwon-si (KR); Cheol-ho Jeon, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 920 days.

(21) Appl. No.: 13/164,532

(22) Filed: Jun. 20, 2011

(65) Prior Publication Data
US 2011/0309336 A1 Dec. 22, 2011

(30) Foreign Application Priority Data
Jun. 18, 2010 (KR) .................. 10-2010-0058229

(51) Int. Cl.
| | |
|---|---|
| H01L 29/06 | (2006.01) |
| H01L 29/778 | (2006.01) |
| B82Y 10/00 | (2011.01) |
| B82Y 30/00 | (2011.01) |
| B82Y 40/00 | (2011.01) |
| H01L 21/28 | (2006.01) |
| H01L 29/16 | (2006.01) |
| H01L 29/49 | (2006.01) |
| H01L 29/73 | (2006.01) |
| H01L 29/76 | (2006.01) |
| H01L 29/786 | (2006.01) |

(52) U.S. Cl.
CPC .............. *H01L 29/778* (2013.01); *B82Y 10/00* (2013.01); *B82Y 30/00* (2013.01); *B82Y 40/00* (2013.01); *H01L 21/28255* (2013.01); *H01L 29/1606* (2013.01); *H01L 29/4908* (2013.01); *H01L 29/7317* (2013.01); *H01L 29/7613* (2013.01); *H01L 29/78684* (2013.01); *Y10T 428/30* (2015.01)

(58) Field of Classification Search
CPC .............................. H01L 29/778; B82Y 10/00
USPC .............. 257/29, E29.255; 438/408; 977/734
See application file for complete search history.

(56) References Cited

U.S. PATENT DOCUMENTS

| | | | | |
|---|---|---|---|---|
| 2009/0155561 | A1* | 6/2009 | Choi et al. | 428/220 |
| 2010/0098877 | A1* | 4/2010 | Cooper et al. | 427/551 |
| 2010/0140723 | A1* | 6/2010 | Kurtz et al. | 257/415 |
| 2010/0179054 | A1* | 7/2010 | Swager | B01J 21/185 502/162 |
| 2011/0003174 | A1* | 1/2011 | Hikata | B82Y 10/00 428/688 |
| 2011/0027639 | A1* | 2/2011 | Deane | H01M 4/02 429/101 |

FOREIGN PATENT DOCUMENTS

JP 2009-182173 A 8/2009

OTHER PUBLICATIONS

Farjam, M. et al., Energy gap opening in submonolayer lithium on graphene: Local density functional and tight-binding calculations, Phys. Rev. B 79, 2009, pp. 1-7.
Ohta, T. et al., Controlling the Electronic Structure of Bilayer Graphene, Science, 2006,313 (5789): pp. 951-954.

(Continued)

*Primary Examiner* — Wael Fahmy
*Assistant Examiner* — Sarah Salerno
(74) *Attorney, Agent, or Firm* — Cantor Colburn LLP

(57) ABSTRACT

A graphene composition including a graphene monolayer and an alkali metal disposed on the graphene monolayer.

18 Claims, 7 Drawing Sheets

(56) References Cited

OTHER PUBLICATIONS

Han et at., "Energy Band-Gap Engineering of Graphene Nanoribbons", Physical Review Letters, 2007, pp. 206805-1-206805-4.

Kim et el., "Large-scale pattern growth of graphene films for stretchable transparent electrodes", Nature, vol. 457, 2009, pp. 706-710.

Liu et al., "Universal Segregation Growth Approach to Wafer-size Graphene from Non-Noble Metals", Nano Lett., vol. 11, 2011, pp. 297-303.

* cited by examiner

WAVENUMBER
(k, 1/angstrom)

SEMICONDUCTING GRAPHENE COMPOSITION, AND ELECTRICAL DEVICE INCLUDING THE SAME

CROSS-REFERENCE TO RELATED APPLICATIONS

This application claims priority to Korean Patent Application No. 10-2010-0058229, filed on Jun. 18, 2010, and all the benefits accruing therefrom under 35 U.S.C. §119, the content of which in its entirety is herein incorporated by reference.

BACKGROUND

1. Field

The present disclosure relates to a semiconducting graphene composition and electrical devices including the same. The semiconducting graphene composition may be used in various electrical devices, such as transistors.

2. Description of the Related Art

Generally, graphite is an allotropic form of carbon in which two-dimensional ("2D") sheets of graphene are stacked. There are two allotropic forms of graphite with different stacking arrangements: hexagonal and rhombohedral. The carbon atoms of the graphene sheets are connected to each other in an extended array of hexagonal rings. Recently, one or more graphene sheets were removed from graphite to study the characteristics of a single graphene sheet, and it was observed that a single graphene sheet has very useful characteristics as compared to existing materials.

For example, the single graphene sheet has metallic properties, and thus is electrically conductive. Thus, the single graphene sheet does not have a band gap. A band gap diagram of the single graphene sheet having metallic properties is illustrated in FIG. 1. Accordingly, in order to provide a single graphene sheet having semiconducting properties, there is a need to form a composition having a band gap.

SUMMARY

Provided is a graphene composition having semiconducting properties.

Disclosed is a graphene composition including: a graphene monolayer; and an alkali metal disposed on the graphene monolayer.

Also provided is an electrical device including the graphene composition.

Additional aspects will be set forth in part in the description which follows and, in part, will be apparent from the description, or may be learned by practice of the presented embodiments.

BRIEF DESCRIPTION OF THE DRAWINGS

The patent or application file contains at least one drawing executed in color. Copies of this patent or patent application publication with color drawings will be provided by the Office upon request and payment of the necessary fee.

These and/or other aspects will become apparent and more readily appreciated from the following description of the embodiments, taken in conjunction with the accompanying drawings in which.

DETAILED DESCRIPTION

Figure 1:
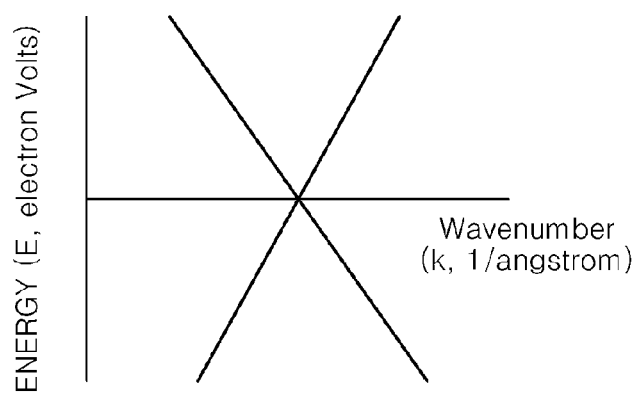
FIG. 1 is a graph of energy (E, electron volts) versus wavenumber (k, 1/nanometers) and is a band diagram of graphene.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Alkane" means a straight or branched chain saturated hydrocarbon.

"Alkyl" means a straight or branched chain, saturated, monovalent hydrocarbon group (e.g., methyl or hexyl).

"Alkenyl" means a straight or branched chain, monovalent hydrocarbon group having at least one carbon-carbon double bond (e.g., ethenyl (—HC=CH$_2$)).

"Alkynyl" means a straight or branched chain, monovalent hydrocarbon group having at least one carbon-carbon triple bond (e.g., ethynyl).

"Aryl," means a cyclic moiety in which all ring members are carbon and at least one ring is aromatic (e.g., phenyl or napthyl).

"Arylalkyl" means an aryl group covalently linked to an alkyl group that is linked to a compound (e.g., a benzyl is a C7 arylalkyl group).

"Alkoxy" means an alkyl group that is linked via an oxygen (i.e., alkyl-O—), for example methoxy, ethoxy, and sec-butyloxy groups.

The term "halogenated" means a group or compound including one more of a fluoro, chloro, bromo, iodo, and astatino substituent. A combination of different halogen groups (e.g., bromo and fluoro) can be present.

The prefix "hetero" means that the compound or group includes at least one ring that is a heteroatom (e.g., 1, 2, or 3 heteroatom(s)), wherein the heteroatom(s) is each independently N, O, S, Si, or P.

The term "graphene" as used herein refers to a polycyclic aromatic molecule comprising a plurality of carbon atoms connected to each other by a covalent bond. The plurality of carbon atoms may form a six-membered ring as a standard repeating unit, or may further include 5-membered rings and/or 7-membered rings. Thus, the graphene monolayer is a monolayer of covalently bonded carbon atoms having generally sp$^2$ hybridization, and substantially has a thickness of just one carbon atom. The graphene monolayer generally has a light transparency of about 97 to about 98%.

A composition comprising a graphene monolayer and an alkali metal disposed on the graphene monolayer is disclosed.

Figure 2:
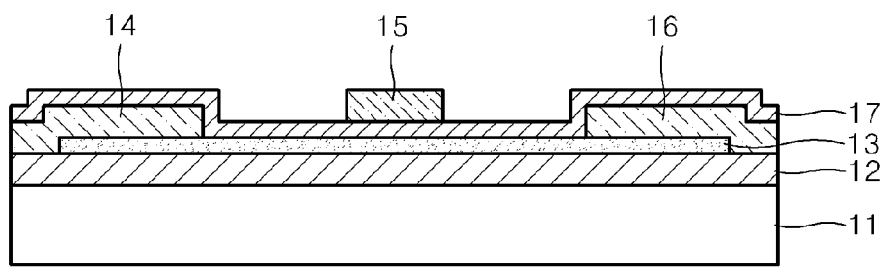
FIG. 2 is a schematic view of an embodiment of a field effect transistor.

As is illustrated in FIG. 1, graphene does not have a band gap and is electrically conductive. When an alkali metal is disposed on a graphene monolayer to form a graphene composition, a band gap is formed as illustrated in FIG. 2, and the graphene composition has semiconducting properties. While not wanting to be bound by theory, it is believed that when an alkali metal is physically (e.g., non-chemically) bonded to (e.g., is adsorbed) on at least one surface (e.g., a portion of the at least one surface) of the graphene monolayer, separation of charges of the graphene monolayer occurs, thereby forming a band gap.

Because the band gap is formed by a non-chemical bond, for example, a physical bond such as adsorption, a net charge of the graphene is zero. Accordingly and while not wanting to be bound by theory, it is believed that if the band gap is formed using the method described above, because the band gap is formed by only charge localization, the graphene is not damaged and the charge transport properties of the graphene are maintained. Thus a graphene composition having the high charge mobility of graphene and a band gap, and thus semiconducting properties, may be provided.

Because a larger band gap results in a larger value of on current/off current ("$I_{on}/I_{off}$") when the graphene composition is used in a device, the characteristics of an electrical device may be improved by including the graphene composition disclosed herein. The band gap of the graphene composition may be about 0.4 electron volt ("eV") or more, specifically about 0.45 eV to about 0.8 eV, more specifically about 0.6 eV to about 0.8 eV.

The band gap may be selected by selecting the type and/or concentration of the alkali metal, and the alkali metal may include at least one element selected from the group consisting of lithium (Li), sodium (Na), potassium (K), rubidium (Rb), cesium (Cs), and francium (Fr). For example, the alkali metal may be sodium (Na).

The alkali metal may be disposed on at least one surface (e.g., a portion of the at least one surface) of the graphene monolayer, and may be physically (e.g., non-chemically) bonded to (e.g., adsorbed on) the at least one surface by atomic layer deposition ("ALD") or chemical vapor deposition ("CVD"). The alkali metal may form an alkali metal nano-structure on the graphene monolayer, and the alkali metal nano-structure may be a thin film or other two-dimensional structure.

The alkali metal nano-structure on the graphene monolayer may be a 2-dimensional thin film, and may be a nano-dot, a nano-ribbon, a nano-cavity, a nano-rod, a nano-cluster, or a nano-island, and may have a thickness of about 1-atomic layer to about 100-atomic layers, or may have a thickness of about 2.0 to about 200 angstroms (Å), specifically about 4.0 to about 175 Å, more specifically about 6.0 to about 150 Å. The alkali metal may occupy about 30 to about 99 percent ("%"), specifically about 50 to about 90%, more specifically about 60 to about 80% of an entirety of the surface of the graphene monolayer.

While not wanting to be bound by theory, it is believed that by forming a physical (e.g., a non-chemical) bond between the 2-dimensional alkali metal nano structure and the at least one surface of the graphene monolayer, charge localization occurs. Because a band gap is formed without damaging the graphene monolayer, the graphene composition has semiconducting properties and retains the high charge mobility properties of graphene.

In addition, a substrate may be disposed under the graphene composition disclosed above. The substrate may not be limited and, may comprise at least one selected from the group consisting of a plastic, silicon, a glass, a GaN, a silica, nickel, cobalt, iron, platinum, palladium, gold, aluminum, chromium, copper, manganese, molybdenum, rhodium, iridium, tantalum, titanium, tungsten, uranium, vanadium, and zirconium. In an embodiment, the substrate may be selected from the group consisting of an inorganic substrate such as an silicon (Si) substrate, a glass substrate, a GaN substrate, or a silica substrate; a nickel (Ni) substrate; a cobalt (Co) substrate; a iron (Fe) substrate; a platinum (Pt) substrate; a palladium (Pd) substrate; a gold (Au) substrate; an aluminum (Al) substrate; a chromium (Cr) substrate; a copper (Cu) substrate; a manganese (Mn) substrate; a molybdenum (Mo) substrate; a rhodium (Rh) substrate; a iridium (Ir) substrate; a tantalum (Ta) substrate; a titanium (Ti) substrate; a tungsten (W) substrate; a uranium (U) substrate; a vanadium (V) substrate; a zirconium (Zr) substrate; and a plastic substrate.

The alkali metal may be disposed (e.g., deposited) on the graphene monolayer by any of various deposition methods, for example, ALD, CVD, sputtering, or evaporation.

Graphene, on which the alkali metal is to be disposed, may be a graphene monolayer. While not wanting to be bound by theory, it is believed that when an atomic layer thickness of the alkali metal is disposed on the graphene monolayer, a band gap is formed, and thus the graphene composition has a band gap and semiconducting properties. The graphene composition may be manufactured by any of various methods, some of which will now be briefly discussed. Additional details may be determined without undue experimentation.

Graphene may be formed on a graphitization catalyst metallic layer by any of various known methods, including for example, a vapor-phase method or a liquid-phase method.

Graphene Formation Process (Vapor-Phase Method)

A vapor-phase method will now be briefly disclosed. First, a graphitization catalyst is disposed in a form of a film, and then heat-treated while contacting a vapor-phase carbon compound thereto, thereby forming graphene. Then, the formed graphene is grown in a cooler condition. That is, a vapor-phase carbon compound is directed at a selected pressure into a chamber in which a graphitization catalyst is present in a form of a film, and then heat-treated at a selected temperature for a selected time period, thereby forming graphene. In the forming of the graphene, the carbon atoms present in the vapor-phase carbon compound are bonded to each other to form a hexagonal planar structure. Then, the graphene is cooled at a selected cooling rate to form a graphene sheet having a uniform arrangement on the graphitization catalyst metallic layer.

In the graphene formation process disclosed above, the vapor-phase carbon compound may be any of various materials that comprise carbon and are present in a vapor phase at a temperature of 300° C. or more. The vapor-phase carbon compound may be any carbon-containing compound. For example, the vapor-phase carbon compound may be a compound including six or fewer carbon atoms, a compound including four or fewer carbon atoms, or a compound including two or fewer carbon atoms. For example, the vapor-phase carbon compound may include at least one selected from the group consisting of carbon monoxide, ethane, ethylene, ethanol, acetylene, propane, propylene, butane, butadiene, pentane, pentene, cyclopentadiene, hexane, cyclohexane, benzene, and toluene.

The vapor-phase carbon compound may be directed at a selected pressure into a chamber in which a graphitization catalyst is present. The vapor-phase carbon compound may be used alone or in a combination with an inert gas, such as helium or argon.

Alternatively, hydrogen may be further included together with the vapor-phase carbon compound. While not wanting to be bound by theory, it is believed that hydrogen maintains a cleanliness of surface of the metal layer containing the catalyst, and thus may control the reaction of the vapor-phase carbon compound with the metal layer. Hydrogen may be included in the range of about 5 to about 40 percent ("%") by volume of the chamber, specifically in the range of about 10 to about 30% by volume, more specifically in the range of about 15 to about 25% by volume.

When the vapor-phase carbon compound is directed into the chamber in which the graphitization catalyst is present in a film form and then heat-treated at a selected temperature, graphene is formed on a surface of the graphitization catalyst metallic layer. The heat treatment temperature may play a role in the forming the graphene, and may be, for example, in the range of about 300 to about 2000° C., specifically in the range of about 500 to about 1500° C., more specifically in the range of about 600 to about 1400° C.

An amount of the formed graphene may be controlled by performing the heat treatment at a selected temperature for a selected time period. That is, when the heat treatment process is performed for a relatively long time period, more graphene is formed, thus, the thickness of the formed graphene is greater, whereas, when the heat treatment process is performed for a relatively short time period, the thickness of graphene is less. Accordingly, in manufacturing a monolayer graphene having a target thickness, the heat treatment time may also play a role, in addition to the type and supply pressure of a vapor-phase carbon compound, the size of a graphitization catalyst, and the size of a chamber. The heat treatment time may be in the range of, for example, about 0.001 to about 1,000 hours, specifically about 0.01 to about 100 hours, more specifically about 0.1 about 10 hours.

A heat source for the thermal treatment is not limited, and may be provided by induction heat, radiant heat, a laser, infrared ("IR") heat, microwaves, plasma, ultraviolet ('UV") rays, or a surface plasmon. The heat source may be attached to the chamber and may increases the temperature of the chamber to a selected temperature.

After the heat treatment, a cooling process may be selectively performed on the resulting product obtained after the thermal treatment. The cooling process may be performed so that the patterned graphene is uniformly grown and disposed. Because sudden cooling may generate cracks in formed graphene, the resulting product may be slowly cooled at a uniform rate. For example, the resulting product may be cooled at a rate from about 0.1° C. to about 10° C. per minute, or may be cooled naturally (e.g., by ambient convection). The cooling of the resulting product naturally is performed by simply removing the heat source used for the thermal treatment, and by removing only the heat source, a sufficient cooling rate may be obtained.

In an embodiment, the heat treatment and the cooling process disclosed above may be performed once. However, the heating and cooling cycle may be repeatedly performed to generate graphene having a dense structure.

The graphitization catalyst may be in the form of a film having a planar structure, and contacts the vapor-phase carbon compound so as to facilitate the formation of a hexagonal planar structure of carbon elements provided from the vapor-phase carbon compound. The graphitization catalyst may be a catalyst used in graphite synthesis, carbonation induction, or carbon nanotube production. For example, the graphitization catalyst may include at least one element selected from the group consisting of Ni, Co, Fe, Pt, Au, Al, Cr, Cu, Mg, Mn, Mo, Rh, Si, Ta, Ti, W, U, V, and Zr.

Graphene manufactured using the vapor-phase method disclosed above may have a uniform structure and may be substantially or entirely without defects. While not wanting to be bound by theory, it is believed that the defect-free nature of the resulting graphene is because a vapor phase material and a high-temperature heat treatment are used.

Additional details of the vapor-phase method of graphene formation may be determined by one of skill in the art without undue experimentation.

Graphene Formation Process (Polymerization)

The graphene monolayer may also be formed using a polymerization process. The formation of graphene by a polymerization process is performed by contacting the graphitization catalyst metallic layer and a liquid carbon compound. For example, the liquid carbon compound may be a carbon-containing polymer and may be disposed (e.g., coated) on the graphitization catalyst metallic layer disclosed above.

Any carbon-containing compound may be used as a liquid carbon compound. When a self-assembled polymer is used, the self-assembled polymer may be vertically arranged in a regular pattern on the graphitization catalyst metallic layer, and the resulting patterned graphene may have a high density.

The self-assembled polymer, which forms a self-assembled layer, may comprise at least one compound selected from the group consisting of an amphiphilic compound, a liquid crystal compound, and a conductive polymer. A combination comprising at least one of the foregoing can be used. In an embodiment, the amphiphilic compound may be an amphiphilic polymer, and the liquid crystal compound may be a liquid crystal polymer.

Because the amphiphilic compound has both hydrophilic and hydrophobic functional groups in a structure thereof, the amphiphilic compound may be disposed in a uniform arrangement, such as a Langmuir-Blodgett arrangement, a dipping arrangement, or a spin arrangement, from an aqueous solution. The amphiphilic compound may comprise a hydrophilic functional group including at least one selected from the group consisting of an amino group, a hydroxyl group, a carboxyl group, a sulfate group, a sulfonate group, a phosphate group, and a salt thereof. The hydrophobic functional group may comprise at least one selected from the group consisting of a halogen atom, a $C_1$-$C_{30}$ alkyl group, a $C_1$-$C_{30}$ halogenated alkyl group, a $C_2$-$C_{30}$ alkenyl group, a $C_2$-$C_{30}$ halogenated alkenyl group, a $C_2$-$C_{30}$ alkynyl group, a $C_2$-$C_{30}$ halogenated alkynyl group, a $C_1$-$C_{30}$ alkoxy group, a $C_1$-$C_{30}$ halogenated alkoxy group, a $C_1$-$C_{30}$ heteroalkyl group, a $C_1$-$C_{30}$ halogenated heteroalkyl group, a $C_6$-$C_{30}$ aryl group, a $C_6$-$C_{30}$ halogenated aryl group, a $C_7$-$C_{30}$ arylalkyl group, and a $C_7$-$C_{30}$ halogenated arylalkyl group. The amphiphilic compound may include at least one selected from the group consisting of a decanoic acid, a lauric acid, a palmitic acid, a stearic acid, a myristoleic acid, a palmitoleic acid, an oleic acid, a stearidonic acid, a linolenic acid, a caprylamine, a laurylamine, a stearylamine, and an oleylamine.

The liquid crystal compound is arranged in a uniform orientation in liquid. The conductive polymer forms a crystalline structure by self-assembling in a layer of the polymer when a solvent used to dissolve the conductive polymer vaporizes from the layer. Accordingly, the liquid crystal compound and/or the conductive polymer may be disposed by a method such as dipping, spin coating, or the like. Examples of the liquid crystal compound and the conductive polymer include a polyacetylene polymer, a polypyrrole polymer, a polythiophene polymer, a polyaniline polymer, a polyfluoro polymer, a poly(3-hexylthiophene)polymer, a polynaphthalene polymer, a poly(p-phenylene sulfide) polymer, a poly(p-phenylene vinylene) polymer, and a combination comprising at least one of the foregoing.

The carbon-containing compound may include at least one polymerizable functional group, such as a carbon-carbon double bond or carbon-carbon triple bond, in a structure thereof. The at least one polymerizable functional group may enable polymerization of the carbon-containing compound and/or cross-linking through a polymerization process, such as process comprising ultraviolet light irradiation after forming a layer thereof. The carbon-containing polymer obtained therefrom may have a large molecular weight, and thus may substantially reduce or effectively prevent carbon from volatizing during thermal treatment.

Such a carbon-containing polymer may be polymerized before or after being coated on the graphitization catalyst metallic layer. In an embodiment, when the carbon-containing polymer is polymerized before being coated on the graphitization catalyst metallic layer, a polymerization layer obtained through a separate polymerization process may be transferred on to the graphitization catalyst metallic layer to obtain a carbonaceous material layer.

The carbon-containing polymer may be disposed on the graphitization catalyst metallic layer by any suitable method. For example, the carbon-containing polymer may be disposed on a surface of the graphitization catalyst metallic layer using a Langmuir-Blodgett method, a dip coating method, a spin coating method, or a vacuum-deposition method. Through such a coating method, the carbon-containing polymer may be coated on a portion of or on an entire surface of a substrate or the graphitization catalyst metallic layer.

Among the self-assembled organic materials disclosed above, the molecular structure of the amphiphilic organic material includes both a hydrophilic portion and a hydrophobic portion. A hydrophilic portion of the amphiphilic organic material may bind to the hydrophilic graphitization catalyst, and thus, may be evenly arranged on the graphitization catalyst metallic layer. As a result, a hydrophobic portion of the amphiphilic organic material is disposed in a direction away from the substrate, and thus may bind to a hydrophobic portion of another amphiphilic organic material that is not bonded to the graphitization catalyst. When the amount of the amphiphilic organic material is sufficient, the amphiphilic organic material may sequentially stack on the graphitization catalyst film by hydrophilic-hydrophobic bonds. After the amphiphilic organic material forms a plurality of layers, a graphene layer is formed using a thermal treatment. Accordingly, by selecting a suitable amphiphilic organic material, and selecting a thickness of layers of the amphiphilic organic material by varying the amount of the amphiphilic organic material, a monolayer of graphene may be obtained. Thus, graphene having a desired thickness may be prepared.

Additional details of the polymerization method of graphene formation may be determined by one of skill in the art without undue experimentation.

Graphene Formation Process (Liquid-Phase Method)

The graphene monolayer may also be formed by using a liquid-phase method. In the liquid-phase method, the graphitization catalyst metallic layer contacts a liquid carbon compound and then the resulting material is heat-treated to form graphene.

In the contacting of the graphitization catalyst metallic layer and the liquid carbon compound, the graphitization catalyst metallic layer is immersed in the liquid carbon compound, which is a carbonaceous material, and then pre-heating is performed thereon.

The liquid carbon compound used in the liquid phase method may be any organic solvent containing carbon and that may be thermally decomposed by a reaction with the graphitization catalyst. The hydrocarbon material may be a polar organic solvent or non-polar organic solvent having a boiling point of about 60 to about 400° C., specifically about 70 to about 350° C., more specifically about 80 to about 300° C. Examples of such organic solvents may include an alcohol, an ether, a ketone, an ester, and an organic acid. An alcohol or an ether may provide desirable adsorption to the graphitization catalyst, reactivity and reducing power. Examples of the alcohol include a monovalent alcohol and a polyvalent alcohol (e.g., a polyol), which may be used alone or in a combination thereof. Examples of the monovalent alcohol include propanol, pentaol, hexanol, heptanol, and octanol, and examples of the polyvalent alcohol include propylene glycol, diethylene glycol, dipropylene glycol, triethylene glycol, tripropylene glycol, octylene glycol, tetraethylene glycol, neopentyl glycol, 1,2-butandiol, 1,3-butandiol, 1,4-butandiol, 2,3-butandiol, dimethyl-2,2-butandiol-1,2, and dimethyl-2,2-butandiol-1,3. The monovalent alcohol and the polyvalent alcohol each independently may further include an ether group, in addition to a hydroxyl group.

When the liquid carbon compound is used, carburization may be performed by pre-heating. The liquid carbon compound may be thermally decomposed during the pre-heating due to a reaction with the graphitization catalyst. Thermal decomposition of a liquid hydrocarbon material by a graphitizing catalyst is known, see for example R. D. Cortright et al, Nature, Vol. 418, page 964 (2002), the content of which in its entirety is herein incorporated by reference. For example, a thermal decomposition product of an organic solvent such as polyvalent alcohol may include an alkane, $H_2$, $CO_2$, and $H_2O$, and a carbon component of the thermal decomposition product may permeate into a catalyst.

The pre-heating for thermal decomposition may be performed at a temperature of 100 to 400° C. for 10 minutes to 24 hours, specifically 110 to 375° C. for 20 minutes to 22 hours, more specifically 120 to 350° C. for 30 minutes to 20 hours.

In addition, when a carburization method is used, the amount of carbon in a catalyst may be controlled by varying the degree of carburization. Thus, the thickness of a graphene layer formed in a subsequent process may also be controlled to provide a monolayer. For example, if a liquid carbon compound that is prone to thermal decomposition is used, a large amount of carbon may be decomposed and permeated into the catalyst during the thermal decomposition reaction of the liquid carbon compound. In addition, the amount of carbon permeated into the catalyst may also be controlled by varying the preheating temperature and duration. Thus, the rate of growth of graphene may be controlled. Thus, while not wanting to be bound by theory, it is believed that it may be easier to control the thickness of the graphene layer to provide a monolayer.

As is further disclosed above, a carbon-containing polymer or a liquid carbon compound is brought into contact with the graphitization catalyst metallic layer, and then a heat treatment is performed thereon, thereby forming graphene on the graphitization catalyst metallic layer. The heat treatment may be performed in the same manner as in the vapor-phase method.

Additional details of the liquid-phase method of graphene formation may be determined by one of skill in the art without undue experimentation.

Graphene Formation Process (SiC Method)

Graphene may be formed directly on a substrate without use of a carbon supply source. An example of the substrate is a SiC wafer. On the SiC wafer, graphene grows epitaxially on silicon and carbon surfaces of the SiC wafer. Graphene grows more uniformly on the silicon surface than on the carbon surface of the SiC wafer.

The SiC wafer used as the substrate may have a thickness of about 1 nm to about 500 μm. Within the range, carbon may be sufficiently supplied for growth of graphene. The resultant structure is heat treated to form a graphene structure.

When a SiC wafer, which is a carbon-containing substrate, is used as the substrate, a carbon supply source is not required since the SiC wafer itself is used as a carbon supply source. In this case, a Si—C bond inside the SiC wafer is weaken due to the heat treatment and thus carbon is decomposed and emitted to the surface and the emitted carbon atoms are bonded to each other to form graphene.

The heat treatment for forming a graphene structure using the SiC wafer as a substrate may be performed under vacuum conditions or in an inert gas atmosphere, at a temperature of about 1000° C. to about 2000° C. for about 1 min to 2 hours.

The inert gas atmosphere refers to a case in which a chamber is filled with an inert element, such as argon or helium, and a pressure therein may be about 100 to about 700 torr.

A graphene monolayer manufactured by the various methods disclosed above may have an area of 1 square centimeter ("$cm^2$") or more, and the graphene monolayer may have few if any defects. Thus, the graphene monolayer may have 10 or fewer, specifically 8 or fewer, more specifically 6 or fewer wrinkles per 1000 square micrometers area. In addition, the graphene monolayer may have a purity of equal to or greater than about 99%, specifically about 99.9%, more specifically about 99.99%.

The graphene composition that has semiconducting properties due to addition of an alkali metal to the prepared graphene monolayer may be used in various electrical devices, for example, a sensor, a bipolar junction transistor, a field effect transistor, a heterojunction bipolar transistor, a single electron transistor, a light emitting diode, or an organic electroluminescent diode.

FIG. 2 is a schematic view of an embodiment of a field effect transistor. Referring to FIG. 2, a silica substrate 12 is disposed on a substrate 11, and graphene composition 13 having semiconducting properties is disposed on the silica substrate 12. A source electrode 14 and a drain electrode 16 are disposed on opposite sides of the gate electrode, and an insulating layer 17 is disposed between the source and drain electrodes 14 and 16 and a gate electrode 15. In this regard, a current flowing between the source and drain electrodes 14 and 16 is controlled by applying a voltage to the gate electrode 15. More specifically, the graphene composition 13 constitutes a channel region, and a current flowing between the source electrode and the drain electrode is controlled by applying a voltage to the gate electrode, thereby performing on/off operation.

In this regard, the distance between the source electrode 14 and the drain electrode 16 may be selected depending on the purpose of a field effect transistor, and may be in a range of about 0.1 micrometer (μm) to about 1 millimeter (mm). For example, the distance between the source electrode 14 and the drain electrode 16 may be in a range of about 1 μm to about 100 μm, specifically, about 5 μm to about 100 μm.

In an embodiment of the field effect transistor, the insulating layer 17 may comprise any electrically insulating material that may be disposed in the form of a thin film. Examples of the electrically insulating material may include a metal oxide (including an oxide of silicon), a metal nitride (including a nitride of silicon), a polymer, or a low molecular weight organic material, each of which has an electric resistance of 10 ohm centimeters (Ωcm) or more. For example, the insulating layer 17 may comprise an inorganic oxide having a high relative dielectric constant.

Examples of the inorganic oxide include at least one selected from the group consisting of silicon oxide, aluminum oxide, tantalum oxide, titanium oxide, tin oxide, vanadium oxide, titanium acid barium strontium, zirconium acid titanium acid barium, zirconium acid titanium acid lead, titanium acid lead lanthanum, titanium acid strontium, titanium acid barium, barium magnesium fluoride, lanthanum oxide, fluorine oxide, magnesium oxide, bismuth oxide, titanium acid bismuth, niobium oxide, titanium acid strontium bismuth, tantalum acid strontium bismuth, tantalum pentoxide, tantalum acid niobium acid bismuth, and trioxide yttrium. For example, the inorganic oxide may be silicon oxide, aluminum oxide, tantalum oxide, or titanium oxide.

In addition, the insulating layer 17 may comprise an inorganic nitride such as a silicon nitride (e.g., $Si_3N_4$, or $Si_xN_y$ (x, y>0)) or an aluminum nitride.

The insulating layer 17 may also be formed using a precursor material containing a metal alkoxide. For example, a solution including the precursor material may be coated on a substrate and then subjected to a chemical solution treatment including a heat treatment process, thereby forming an insulating layer.

The metal alkoxide contains a metal and an alkoxide group. The metal contained in the metal alkoxide may be at least one selected from the group consisting of a transition metal, a lanthanoid, and a main group element. For example, the metal may be at least one selected from the group consisting of barium (Ba), strontium (Sr), titanium (Ti), bismuth (Bi), tantalum (Ta), zirconium (Zr), iron (Fe), nickel (Ni), manganese (Mn), lead (Pb), lanthanum (La), lithium (Li), sodium (Na), potassium (K), rubidium (Rb), cesium (Cs), francium (Fr), beryllium (Be), magnesium (Mg), calcium (Ca), niobium (Nb), thallium (Tl), mercury (Hg), copper (Cu), cobalt (Co), rhodium (Rh), scandium (Sc), and yttrium (Y). The alkoxide contained in the alkoxide metal may be derived from an alcohol or an alkoxy alcohol (e.g., an ether). Examples of the alcohol include methanol, ethanol, propanol, isopropanol, butanol, and isobutanol. Examples of the alkoxy alcohol include methoxy ethanol, ethoxy ethanol, propoxy ethanol, butoxy ethanol, pentoxy ethanol, heptoxy ethanol, methoxy propanol, ethoxy propanol, propoxy propanol, butoxy propanol, pentoxy propanol, and heptoxy propanol.

If the insulating layer 17 is comprises such a material, polarization in the insulating layer may be facilitated, and a threshold voltage for driving a transistor may be lowered. In addition, when the insulating layer comprises a silicon nitride such as $Si_3N_4$, $Si_xN_y$, or $SiON_x$ (x, y>0), a depletion layer may be more easily formed and the threshold voltage for driving a transistor may be further lowered.

Examples of the low molecular weight organic material include a polyimide, polyamide, polyester, polyacrylate, an optical radical polymerization system, a photocurable resin of an optical cation polymerization system, an acrylonitrile-containing copolymer, a polybiphenol, polybivinylalcohol, a novolac resin, and cyanoethylpullulan.

Examples of the polymer include wax, polyethylene, polychloropyrene, polyethylenetelephthalate, polyoxymethylene, polyvinylchloride, polyvinylidene fluoride, polymethylmethacrylate, polysulfone, polycarbonate, polyimidcyanoethyl pullulan, poly(vinylphenol) ("PVP"), poly(methylmethacrylate) ("PMMA"), polycarbonate ("PC"), polystyrene ("PS"), polyolefin, polyacrylamide, poly (acrylic acid), novolak resin, resol resin, polyimide, polyxylene, epoxy resin, or a polymer having a high dielectric constant such as pullulan.

The insulating layer 17 may be a mixed layer comprising at least two materials selected from the inorganic or organic compounds disclosed above, or may have a stacked structure including layers comprising the inorganic and organic compounds. In this regard, the performance of a manufactured device may be selected by combining a material having a high dielectric constant and a material having water repellency or by stacking a layer comprising a material having a high dielectric constant and a layer comprising a material having water repellency.

The insulating layer 17 may be formed by a dry process, a coating process, or a wetting process. Examples of the dry process include a vacuum deposition method, a molecular beam epitaxial growth method, an ion cluster beam method, a low energy ion beam method, an ion plating method, a chemical vapor deposition ("CVD") method, a sputtering method, and an atmospheric plasma method. Examples of the coating method include a spray coating method, a spin coating method, a blade coating method, a dip coating method, a casting coating method, a roll coating method, a bar coating method, and a dye coating method. Examples of the wetting process include a printing method and an ink-jetting method. These methods may be appropriately selected according to a material of the insulating layer. The wetting process may be performed using a sol-gel method. An example of the wetting process is a sol-gel method in which a dispersion prepared by dispersing particulates of an inorganic oxide in an organic solvent or water by optionally using a dispersing agent such as a surfactant is coated and dried, or a solution of an oxide precursor, for example, alkoxide is coated and then dried.

A metallic atomic layer and/or a metallic ion layer may be further disposed between the graphene composition 13 and the insulating layer 17. The metallic atomic layer may include Zn, Al, Ga, Zr, Ni, Co, Pd, or a combination thereof. The metallic ion layer may include an ion of Zn, Al, Ga, Zr, Ni, Co, Pd, or a combination thereof, each of which may present in a form of a metallic salt. An anion of the metallic ion layer may be a halide, $COO^-$, $NO_3^-$, $SO_4^{2-}$, or $CO_3^{2-}$. The metallic atomic layer and/or metallic ion layer may have a thickness equivalent to one through three layers of a metallic atom or a metallic ion.

The metal atomic or metal ionic layer may be formed using any method known in the field. For example, the metal atomic or metal ionic layer may be formed using a dry process, a coating process, or a wetting process. Examples of the dry process include a vacuum deposition method, a molecular beam epitaxial growth method, an ion cluster beam method, a low energy ion beam method, an ion plating method, a chemical vapor deposition ("CVD") method, a sputtering method, and an atmospheric plasma method. Examples of the coating method include a spray coating method, a spin coating method, a blade coating method, a dip coating method, a casting coating method, a roll coating method, a bar coating method, and a dye coating method. Examples of the wetting process include a printing method and an ink-jetting method. These methods may be appropriately selected according to a material for forming the insulating layer.

In the field-effect transistor, for example, a thin film transistor ("TFT"), a substrate that supports the structure of the TFT may be a glass substrate, an inorganic compound, such as a metal oxide or nitride, a plastic film (e.g., PET, PES, or PC), a metal substrate, or a composite or a stack thereof. In addition, if other elements, other than the substrate, sufficiently support the structure of a thin film transistor, the substrate may be omitted. In an embodiment, a silicon (Si) wafer is used as a substrate. In this regard, Si itself is used as both a gate electrode and a substrate. Moreover, a surface of a Si substrate is oxidized to form $SiO_2$ which functions as an insulating layer. In this regard, a metal layer, for example, a gold (Au) layer as an electrode for connection to a lead line may be formed on the Si substrate functioning both as a substrate and a gate electrode.

In an embodiment of a TFT, a gate, a source, and a drain electrode may each independently include a conductive material. For example, each of the gate, source, and drain electrodes may each independently comprise at least one selected from the group consisting of platinum (Pt), gold (Au), silver (Ag), nickel (Ni), chromium (Cr), copper (Cu), iron (Fe), tin (Sn), hard lead (Pb), tantalum (Ta), indium (In), palladium (Pd), tellurium (Te), rhenium (Re), iridium (Ir), aluminum (Al), ruthenium (Ru), germanium (Ge), molybdenum (Mo), tungsten (W), tin oxide antimony, indium oxide tin (ITO), fluoride-doped zinc oxide, zinc (Zn), carbon (C), graphite, glass-phase carbon, silver paste, carbon paste, lithium (Li), beryllium (Be), sodium (Na), magnesium (Mg), potassium (K), calcium (Ca), scandium (Sc), titanium (Ti), manganese (Mn), zirconium (Zr), gallium (Ga), niobium (Nb), an alloy containing sodium (Na) and potassium (K), magnesium (Mg), lithium (Li), aluminum (Al), a combination containing magnesium (Mg) and copper (Cu), a combination containing magnesium (Mg) and silver (Ag), a combination containing magnesium (Mg) and aluminum (Al), a combination containing magnesium (Mg) and indium (In), a combination containing aluminum (Al) and aluminum oxide, and a combination containing lithium (Li) and aluminum (Al). These materials may be deposited by sputtering or vacuum deposition, for example.

In a TFT according to another embodiment, source and drain electrodes may comprise a fluid electrode material such as a solution, paste, ink, or dispersion of a conductive material. A metallic particulate-containing dispersion may be any known conductive paste, and may be a dispersion that has a metallic particulate having a particle diameter of about 0.5 nanometer (nm) to about 50 nm, or about 1 nm to about 10 nm. Such metallic particulates may be, for example, platinum (Pt), gold (Au), silver (Ag), nickel (Ni), chromium (Cr), copper (Cu), iron (Fe), tin (Sn), hard lead (Pb), tantalum (Ta), indium (In), palladium (Pd), tellurium (Te), rhenium (Re), iridium (Ir), aluminum (Al), ruthenium (Ru), germanium (Ge), molybdenum (Mo), tungsten (W), or zinc (Zn).

Such metallic particulates may be dispersed in a dispersion medium such as water or any suitable organic solvent by using a dispersion stabilizer such as an organic material, and the obtained dispersion may be used to form the source electrode and the drain electrode. The dispersion of the metallic particulate may be prepared using a physical method, such as sputtering or metal vapor method, or a chemical method in which a metallic ion is reduced in a liquid phase to generate the metallic particulate. Examples of the chemical method include a colloid method and a co-precipitation method.

The source electrode and the drain electrode may be disposed (e.g., molded) using the metallic particulate dispersion, a solvent used is removed, and the resulting molded structure is heated at a temperature of about 100 to about 300° C., specifically about 150 to about 200° C., while maintaining the shape of the molded structure, thereby thermally fusing the metallic particulate to form an electrode pattern having a selected shape.

In addition, the gate, source, and drain electrodes may each independently comprise a conductive doped polymer that provides high conductivity, such as a conductive polyaniline, a conductive polypyrrole, a conductive polythiophene (e.g., a complex of polyethylenedioxythiophene and polystyrenesulfonic acid), or a complex of polyethylenedioxythiophene ("PEDOT") and polystyrenesulfonic acid. When such materials are used, a contact resistance between the source and drain electrodes and the semiconductor layer may be appropriate.

Among the materials for forming the source and drain electrodes disclosed above, the source electrode and the drain electrode may comprise a material that enables a contact surface between the source and drain electrodes and the semiconductor layer to have an appropriately small electrical resistance. The electrical resistance corresponds to an electric field mobility when a current-control device is manufactured, and a high electric field mobility is obtained when the electric resistance is low.

The gate, source and drain electrodes may be formed by, for example, deposition, electron-beam deposition, sputtering, an atmospheric plasma method, ion plating, chemical vapor deposition ("CVD"), electrodeposition, electroless deposition, spin coating, printing, or ink-jetting. If patterning is further desirable to form the gate, source and/or drain electrodes, a conductive thin film formed by such methods may be patterned by photolithography or a lift-off method, as can be determined by one of skill in the art without undue experimentation. Alternatively, a metal thin film comprised of aluminum or copper may be patterned by forming a resist by thermal transfer or ink-jetting and then performing etching thereon. Alternatively, a solution or dispersion of a conductive polymer, or a dispersion containing a metallic particulate may be directly ink-jetted to form a pattern. Alternatively, lithography and laser polishing may be performed through a porous layer to form a pattern. Alternatively, a conductive polymer, a metallic particulate-containing conductive ink, or a conductive paste may form a pattern by relief printing, engraving printing, flat panel printing, or screen printing.

The thickness of the electrode (e.g., the gate, source and/or drain electrode) may not be limited as long as a current flows therethrough, and may be, for example, in the range of about 0.2 nm to about 10 μm, specifically about 4 nm to about 300 nm. If the thickness of each of the source and drain electrodes is within this range, a resistance is appropriate due to the selected thickness thereof and thus a significant voltage drop may not occur.

In a TFT according to another embodiment, a buffer layer may be disposed (e.g., formed) between the semiconductor layer and the source and drain electrodes in order to improve injection efficiency. In an embodiment of the n-type TFT, the buffer layer may comprise an alkali metal and comprise at least one element selected from the group consisting of LiF, $Li_2O$, CsF, $NaCO_3$, KCl, $MgF_2$, $CaCO_3$, an alkali earth metal, and a compound having an ionization bond, all of which may be used in an anode of an organic light emitting device. In addition, a compound that may be used to form an electron injection layer or an electron transport layer of an organic light emitting device, such as Alq(tris(8-quinolinol)aluminum complex), may also be used to form the buffer layer.

The buffer layer lowers an injection barrier of carriers and thus lowers a threshold voltage, and enables a transistor to be driven at low voltage. The buffer layer may be located anywhere between the source and drain electrodes and the semiconductor layer. The thickness of the buffer layer may be in a range of about 0.1 nm to about 30 nm, or about 0.3 nm to about 20 nm.

The TFT may be electrically connected to a light emitting device and the light emitting device may be controlled by changing a current flowing between the source electrode and the drain electrode. A flat panel display may comprise the TFT and the light emitting device.

Embodiments will be disclosed in further detail with reference to the following examples. These examples are for illustrative purposes only and are not intended to limit the scope of the present invention.

PREPARATION EXAMPLE 1

Preparation of Graphene Monolayer 2-inch SiC wafer was heat treated at a temperature of 1650° C. for 10 minutes in a chamber filled with 680 torr of argon, and then slowly cooled to form a monolayer-epitaxial graphene structure having a size of 1 mm×10 mm.

Figure 3:
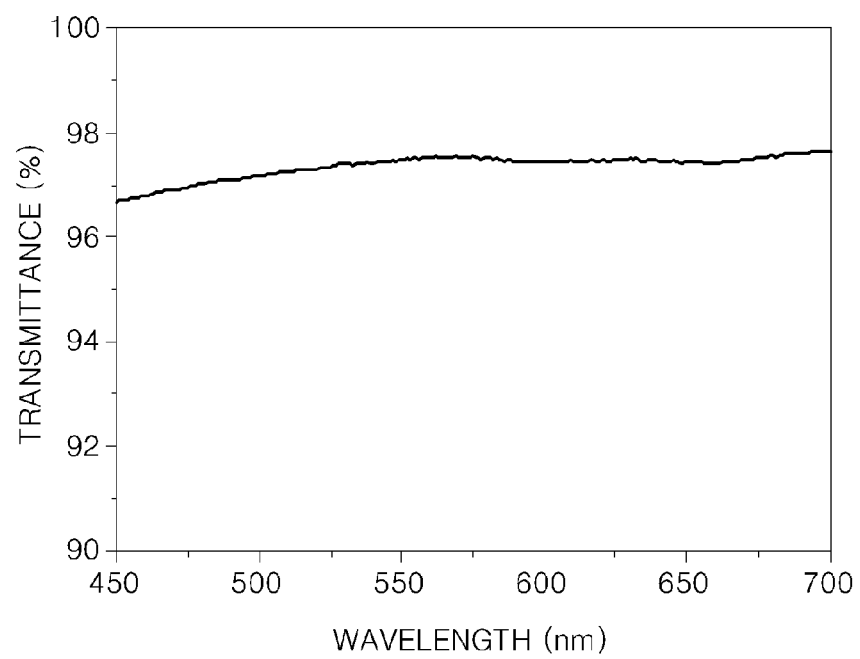
FIG. 3 illustrate an optical transparency of a graphene monolayer obtained according to a preparation example 1.

An optical transparency of the graphene monolayer was measured by an absorption of a light having a wavelength of 450 nm-700 nm. FIG. 3 illustrates the optical transparency of the graphene monolayer. The optical transparency of FIG. 3 shows a value of about 97%-about 98%. It shows that a graphene monolayer was formed in the process.

PREPARATION EXAMPLE 2

Preparation of Graphene Monolayer

Cu foil (75 micrometers, manufactured by Wacopa Co., ltd) was disposed in a chamber. Then, the Cu foil was heat-treated at 1,000° C. for 30 minutes using a halogen lamp while adding hydrogen gas to the chamber at 200 standard cubic centimeters per minute (sccm). And, a mixture gas of $CH_4$ 20 sccm/$H_2$ 4 sccm was added to the chamber for 30 minutes. Then, the heat source was removed, and the chamber was naturally cooled to grow the graphene in a uniform alignment to form a 10 mm by 10 mm graphene monolayer with a thickness of 1 layer.

Then, a chlorobenzene solution (5 weight percent, wt %) in which poly(methyl methacrylate) ("PMMA") was dissolved was coated on the substrate on which the graphene monolayer is formed at 1000 revolutions per minute ("rpm") for 60 seconds. The resultant was immersed in an etchant (CE-100, Transene Co., ltd) for 1 hour to remove the Cu foil to isolate the graphene monolayer attached to PMMA. The graphene monolayer attached to PMMA was placed on a silica/silicon substrate and dried, and then PMMA was removed using acetone. The silica ($SiO_2$) substrate has a size of 1 cm×1 cm and a thickness of 300 μm, and was disposed on a silicon substrate having a size of 1 cm×1 cm and a thickness of 500 μm.

EXAMPLE 1

As shown in the preparation example 1, a graphene monolayer having a size of 1 mm×10 mm was disposed on the SiC substrate.

Then, sodium (Na) was sputtered on to the graphene monolayer, thereby forming a Na layer having a thickness of 10 angstroms (Å).

Figure 5A:
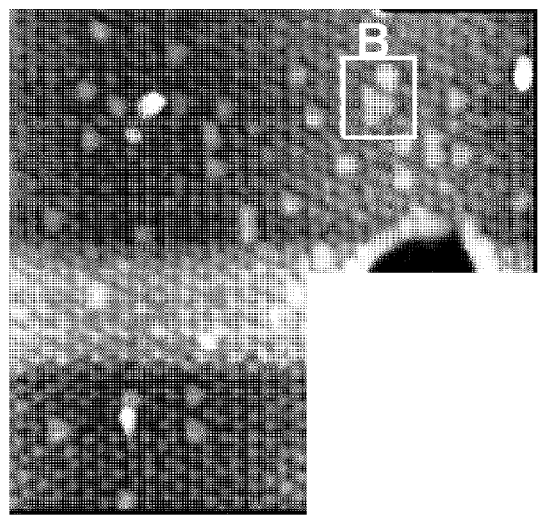
Figure 5B:
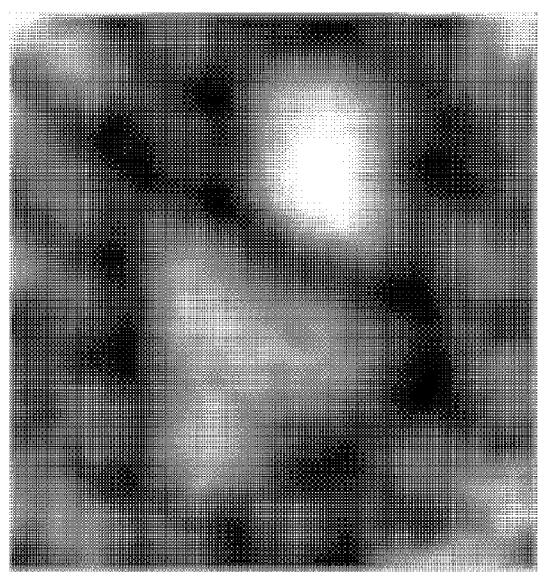
Figure 6A:
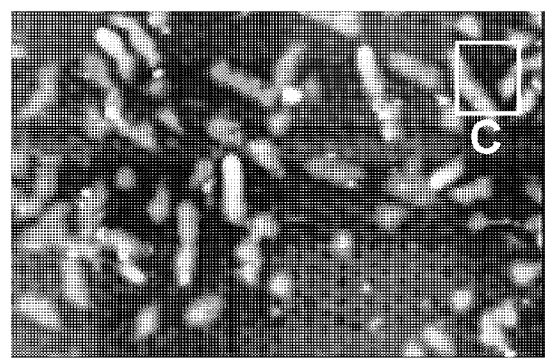
Figure 6B:
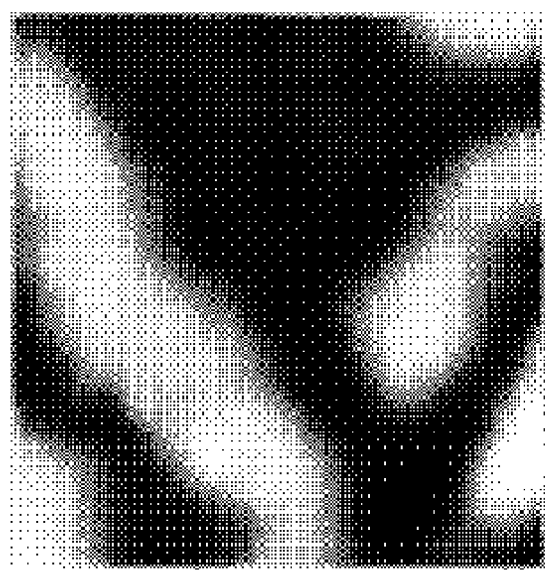
Figure 7A:
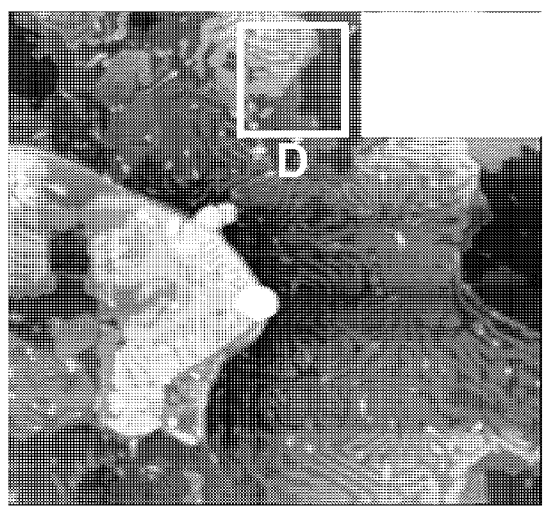
Figure 7B:

FIGS. 4A through 7B illustrate a process of gradually forming sodium structures on the graphene monolayer. FIG. 4B is a partial magnifying view of "A" area marked in FIG. 4A. FIG. 5B is a partial magnifying view of "B" area marked in FIG. 5A. FIG. 6B is a partial magnifying view of "C" area marked in FIG. 6A. FIG. 7B is a partial magnifying view of "D" area marked in FIG. A.

Figure 4A:
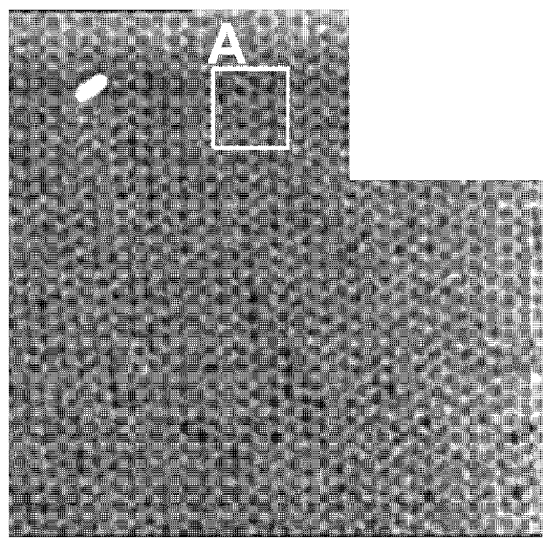
FIG. 4A through FIG. 7B illustrate an embodiment of a process of disposing sodium on a graphene monolayer according to Example 1.
Figure 4B:
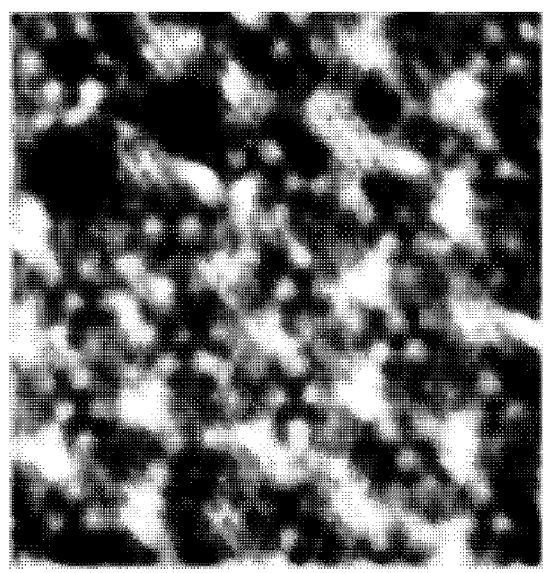

FIGS. 4A and 4B show an initial epitaxial layer of sodium on the graphene monolayer, FIGS. 5A and 5B show a sodium nano cluster, FIGS. 6A and 6B show a sodium nanorod, and FIGS. 7A and 7B show a 2-dimensional sodium thin film structure.

Figure 8:
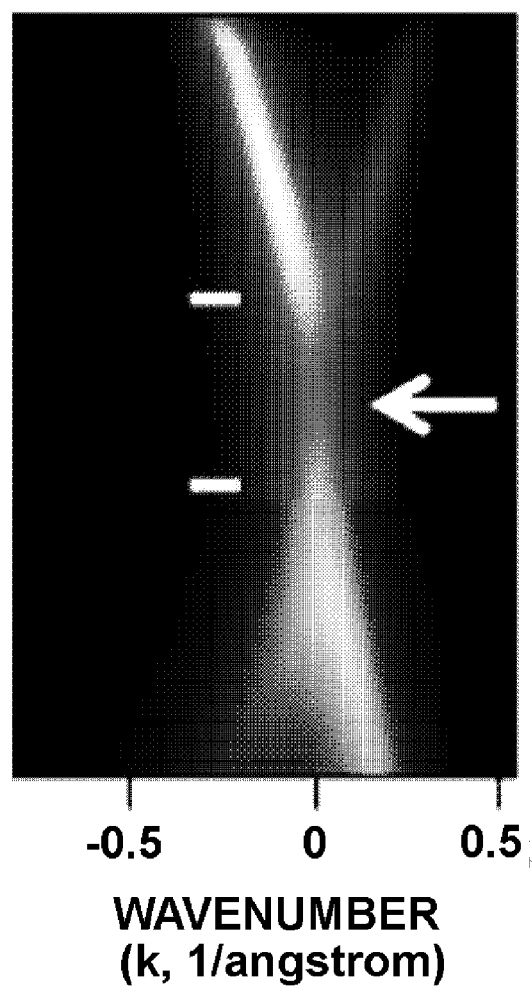
FIG. 8 shows band gap evaluation results of a sodium-containing graphene composition prepared according to Example 1.

FIG. 8 shows band gap evaluation results of the graphene composition comprising a graphene monolayer on which the 2-dimensional sodium thin film structure is formed. The band gap evaluation was obtained using an optical transmission measurement method. Referring to FIG. 8, it can be seen that the graphene composition has a band gap of about 0.8 eV.

EXAMPLE 2

As shown in the preparation example 2, a silica ($SiO_2$) substrate having a size of 1 cm×1 cm and a thickness of 300 μm was disposed on a silicon substrate having a size of 1 cm×1 cm and a thickness of 500 μm, and then a graphene monolayer having a size of 10 mm×10 mm was disposed on the silica ($SiO_2$) substrate.

Then, sodium (Na) was sputtered on to the graphene monolayer, thereby forming a Na layer having a thickness of 10 angstroms (Å).

As further disclosed above and while not wanting to be bound by theory, according an embodiment, the graphene composition comprising the alkali metal on the graphene monolayer has a large band gap due to charge localization caused by a non-chemical bond and thus has semiconducting properties while retaining other desirable characteristics of graphene. The large band gap and high carrier mobility facilitates use of the graphene composition in various electrical devices, such as a transistor.

It shall be understood that the exemplary embodiments described herein are to be considered in a descriptive sense only and not for purposes of limitation. Descriptions of features or aspects within each embodiment are to be considered as available for other similar features or aspects in other embodiments.

What is claimed is:

1. A graphene composition comprising:
   a planar-shaped molecular structure consisting of a graphene monolayer; and
   an alkali metal disposed on the graphene monolayer,
   wherein the alkali metal is in the form of at least one selected from the group consisting of a continuous thin film, a nanorod, and a nanocluster.

2. The graphene composition of claim 1, wherein the alkali metal comprises at least one element selected from the group consisting of lithium, sodium, potassium, rubidium, cesium, and francium.

3. The graphene composition of claim 1, wherein the alkali metal is sodium.

4. The graphene composition of claim 1, wherein the alkali metal is disposed on at least one surface of the graphene monolayer.

5. The graphene composition of claim 1, wherein the alkali metal has a 2-dimensional thin film structure.

6. The graphene composition of claim 1, wherein the alkali metal is in the form of a continuous thin film having a thickness of about 2 to about 200 angstroms.

7. The graphene composition of claim 1, wherein the alkali metal occupies about 30 to about 99 percent of an entire surface of the graphene monolayer.

8. The graphene composition of claim 1, wherein the alkali metal occupies about 50 to about 90 percent of an entire surface of the graphene monolayer.

9. The graphene composition of claim 1, wherein the composition has a band gap of about 0.4 electron volt or more.

10. The graphene composition of claim 1, wherein the graphene composition has a band gap of about 0.45 electron volt to about 0.8 electron volt.

11. The graphene composition of claim 1, wherein the graphene composition has a band gap of about 0.6 electron volt to about 0.8 electron volt.

12. The graphene composition of claim 1, wherein the graphene monolayer has an area of 1 square centimeter or more.

13. The graphene composition of claim 1, wherein the graphene monolayer has 10 or fewer wrinkles per 1000 square micrometers area.

14. The graphene composition of claim 1, wherein a purity of the graphene monolayer is about 99 percent or more.

15. The graphene composition of claim 1, wherein a substrate is further disposed under the graphene monolayer.

16. The graphene composition of claim 15, wherein the substrate comprises at least one selected from the group consisting of a plastic, silicon, a glass, a GaN, a silica, nickel, cobalt, iron, platinum, palladium, gold, aluminum, chromium, copper, manganese, molybdenum, rhodium, iridium, tantalum substrate, titanium, tungsten, uranium; vanadium, and zirconium.

17. An electrical device comprising the graphene composition of claim 1.

18. The electrical device of claim 17, wherein the electrical device is at least one selected from the group consisting of a sensor, a bipolar junction transistor, a field effect transistor, a heterojunction bipolar transistor, a single electron transistor, a light emitting diode, and an organic electroluminescent diode.

* * * * *